(12) United States Patent
Müller et al.

(10) Patent No.: US 7,063,740 B2
(45) Date of Patent: Jun. 20, 2006

(54) PROCESS FOR STRENGTHEN GRAIN BOUNDARIES OF AN ARTICLE MADE FROM A NI BASED SUPERALLOY

(75) Inventors: Steffen Müller, Baden-Dättwil (CH); Joachim Rösler, Braunschweig (DE)

(73) Assignee: ALSTOM Technology Ltd, Baden (CH)

( * ) Notice: Subject to any disclaimer, the term of this patent is extended or adjusted under 35 U.S.C. 154(b) by 0 days.

(21) Appl. No.: 10/777,307

(22) Filed: Feb. 13, 2004
(Under 37 CFR 1.47)

(65) Prior Publication Data
US 2005/0061228 A1   Mar. 24, 2005

(30) Foreign Application Priority Data
Feb. 17, 2003   (EP)   ................... 03405090

(51) Int. Cl.
*C30B 25/12* (2006.01)

(52) U.S. Cl. .............................. 117/3; 117/84; 427/252; 427/253

(58) Field of Classification Search .................... 117/3, 117/84; 427/252, 253
See application file for complete search history.

(56) References Cited
U.S. PATENT DOCUMENTS

| 4,041,196 | A | 8/1977 | Baldi et al. |
| 4,643,782 | A | 2/1987 | Harris et al. |
| 5,732,467 | A | 3/1998 | White et al. |
| 5,759,301 | A | 6/1998 | Konter et al. |
| 5,783,318 | A | 7/1998 | Biondo et al. |
| 5,888,451 | A | 3/1999 | Konter et al. |
| 5,914,059 | A | 6/1999 | Marcin, Jr. et al. |
| 6,233,822 | B1 | 5/2001 | Grossklaus, Jr. et al. |

FOREIGN PATENT DOCUMENTS

| EP | 1 078 996 A1 | 2/2001 |
| EP | 1 186 680 A2 | 3/2002 |
| EP | 1 209 247 A1 | 5/2002 |
| GB | 2 234 521 A1 | 2/1991 |
| WO | 95/35396 | 12/1995 |

OTHER PUBLICATIONS

H.J. Hunger Und G. Trute, "Probleme beim Borieren von Ni-Basiswerkstoffen", 1994, pp. 215-217.
S.C. Deevi and V.K. Sikka "Nickel and iron aluminides: an overview on properties, processing, and applications", Intermetallics 4, Elsevier Science Ltd., Great Britain, 1996, pp. 357-375.
Ed. R.D. Kissinger et al., Taken from: "Superalloys 1996", Pub. The Minerals, Metals and Materials Society, 1996.

*Primary Examiner*—Felisa Hiteshew
(74) *Attorney, Agent, or Firm*—Buchanan Ingersoll PC

(57) ABSTRACT

It is disclosed a method for strengthen the grain boundaries of an article (1) made from a Ni based superalloy while the article (1) is in the solid state and containing at least one grain boundary. A surface diffusion process is applied to the article (1) to enrich the at least one grain boundary with grain boundary strengthening elements of one or a combination of boron, hafnium, zirconium without forming brittle precipitates like borides or carbides.

9 Claims, 2 Drawing Sheets

PROCESS FOR STRENGTHEN GRAIN BOUNDARIES OF AN ARTICLE MADE FROM A NI BASED SUPERALLOY

FIELD OF THE INVENTION

This invention relates according to claim 1 to a method for strengthen grain boundaries of a single crystal (SX) or directionally solidified (DS) article made from a Ni based superalloy while the article is in the solid state after casting.

STATE OF THE ART

Single crystal turbine components are manufactured from Ni based superalloys using a directional solidification technique. Casting a large perfect single crystal component is in practice extremely difficult, with most such components being subject to defects such as grain boundaries, freckles, equiaxed stray grains and microporosity among others. These defects generally weaken the components at high temperature, resulting in an inability to maintain a desired life of the component or a desired temperature of operation of the turbine, which will ensure high turbine efficiency, without risking component failure initiated at the defect. However, to demand nothing but perfect single crystal articles from a foundry would incur a very high scrap rate and concomitant high per-part costs. Thus, the industry trend is to accept as many defects as possible without compromising the lifetime or operating temperature of the components.

One of the most prevalent defects are grain boundaries, which are particularly harmful to the single crystal components high temperature properties. Grain boundaries are regions of high local disorder of the crystal lattice as they are the locations at which neighbouring grains must join together despite a certain misorientation between their lattices. The greater the misorientation, the greater is the disorder (concentration of dislocations) in the grain boundary required to facilitate the fitting together of the two grains. This disorder is directly related to the behaviour of the grain boundary at higher temperatures, making it weaker with respect to the bulk material inside the grains as temperature increases above the "equicohesive temperature", which is generally $0.5T_m$ where $T_m$ [K] is the melting point of the material.

This weakening effect has been clearly established in patent GB-A-2,234,521. The FIG. 4 of the disclosure GB-A-2,234,521 plots stress rupture strength at 871° C. tested across grain boundaries of various degrees of misorientation. Note that for the "base" material (conventional single crystal alloy) there is a sharp drop in the properties when the misorientation exceeds about 6°. The trend is also shown in "Superalloy 1996" (Ed. R. D. Kissinger et al., The Minerals, Metals and Materials Society 1996) for the alloy Rene N5 for stress rupture at 1600° F. and 1800° F. The sudden weakening of the single crystal article containing grain boundaries of misorientation higher than 6° has led to the clear specification that no misorientations above 6° are acceptable.

In the past, Ni based superalloys cast to give an equiaxed grain structure or columnar-grained structure were fortified with elements such as C (carbon) and B (boron) which are known grain boundary strengtheners, as they cause the precipitation of carbides and borides, which are stable at high temperatures, on the grain boundaries. In addition the presence of these elements in solution in the grains and along the grain boundaries slows down diffusion processes at high temperatures, which is a major source of grain boundary weakness.

It was discovered early in the evolution of single crystal alloys that the presence of significant quantities of C and B in the alloys prevented the maximum strength of the alloys from being achieved, for three main reasons:

1. With high levels of carbon or boron, elongated carbides or borides tend to form between dendrites during directional solidification, and these can be crack starters during service,
2. C and B increase the amount of eutectic in the as-cast article, which degrades LCF (Low cycle fatigue) and creep properties and
3. C and B dramatically lower the melting point of the alloy. At the levels present in DS or SX alloys, the incipient melting point is often lower than the gamma prime solvus temperature, which prevents a complete solutioning of gamma prime and re-precipitating at the desired size range, and prevents the complete solutioning of gamma/gamma prime eutectic. This can have a dramatic effect on LCF and creep properties.

For these reasons, C and B levels were kept extremely low in the first generation single crystal superalloys. However, patent GB-A-2,234,521 shows that high temperature properties can be maintained with levels of carbon higher than in conventional single crystal alloys but lower than in previous art DS alloys. The invention disclosed in GB-A-2,234,521 has allowed to raise he defect toleration specification from 6° to 12° for the new alloy, hence the concept of "defect tolerant alloy".

Therefore, EP-A1-1 078 996 relates to a process for the forming of precipitates of carbides and borides along the grain boundaries of an component made from an Ni based superalloy while in solid state. This follows from the finding that the carbides formed by carburization offer similar grain boundary strengthening properties as those cast into the article using the current art without the detrimental effects of adding more carbon to the alloy prior to casting. With advantage the process will be carried out in a way to form secondary carbides in the form $Cr_{23}C_6$, $Cr_7C$, $Cr_6C$ and HfC and may take place before, during or after the normal solution and/or precipitation hardening heat treatments of the component.

Furthermore, other patens are known for the repaired of unwanted casting defects. U.S. Pat. No. 5,783,318 uses a powderized repair alloy that is applied by a low substrate heat input build-up process. U.S. Pat. No. 6,233,822 employs a welding or an HVOF spraying process for restoring dimensional integrity of a gas turbine blade. Also U.S. Pat. No. 5,732,467 proposes a repair process using an HVOF build-up process. U.S. Pat. No. 5,914,059 describes a process using a laser to melt the parent material containing the defect or a repair alloy. Special process parameters have to be found to maintain the single crystal structure.

All aforementioned methods remove the defect before replacing it by similar material. Several complicated process steps are necessary which may cause further component damage due to heat input. This holds particularly true for single crystal components. Additionally, the replaced material exhibits usually a degradation of all properties compared to the parent material.

SUMMARY OF THE INVENTION

It is the object of the present invention to find a method of strengthen the grain boundaries of an article made from a Ni based superalloy, particularly for or directionally solidified single crystal articles, while the article is in the solid state after casting.

According to the present invention a method was found for strengthen grain boundaries of a single crystal (SX) or directionally solidified (DS) article made from a Ni based superalloy while the article is in the solid state after casting and containing at least a grain boundary or a casting defect with at least one grain boundary, the inventive method comprising the step of (a) applying a surface diffusion process to a surface of the article component, thereby (b) diffusing grain boundary strengthening elements of one or a combination of boron, hafnium, zirconium along the at least one grain boundary of the article to enrich the at least one grain boundary with said grain boundary strengthening elements without forming precipitates.

With the present invention the mechanical properties of the defect area are partially restored. The presence of the grain boundary strengthening elements eliminated the detrimental effect of aforementioned casting defects. The present invention relates to the repair of casting defects such as recrystallized grains, spurious grains, slivers and freckles of a single crystal (SX) or directionally solidified (DS) article such as a blade or vane or any other gas turbine component.

As a surface diffusion process a powder pack process, past/slurry application or any other CVD process known from the state of the art is suitable. This process could take place at any time in the manufacturing process such as before, during or after the solution and/or precipitation hardening heat treatments. Metal sheets or other devices can be used to cover defect-free surface parts for protecting them from the applied surface diffusion process. After the surface diffusion, a post-diffusion heat treatment might be applied to intensify the diffusion of the strengthening elements along grain boundaries.

After the surface diffusion processor after post-diffusion process, the defect surface might be re-machined if a smooth and clean surface is needed. A layer of enriched material with the strengthening elements on the surface of the article is thereby removed by chemical or mechanical means.

Before applying the method according to the present invention, there may be a cleaning process to remove oxides and other undesirable contaminants in preparation for presented method.

BRIEF DESCRIPTION OF DRAWINGS

Preferred embodiments of the invention are illustrated in the accompanying drawings, in which.

Figure 1:
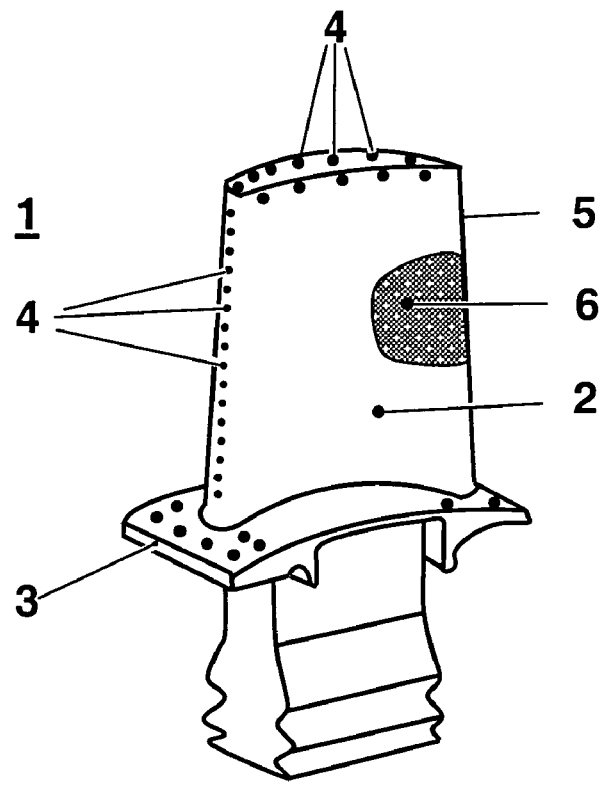
FIG. 1 shows a gas turbine blade as an example.

The drawing shows only parts important for the invention.

DESCRIPTION OF PREFERRED EMBODIMENT

The present invention is generally applicable to components that operate within environments characterised by relatively high temperature, and are therefore subjected to severe thermal stresses and thermal cycling. Notable examples of such components include the high and low pressure nozzles and blades, shrouds, combustor liners and augmentor hardware of gas turbine engines. FIG. 1 shows as an example such an article 1 as blades or vanes comprising a blade 2 against which hot combustion gases are directed during operation of the gas turbine engine, a cavity, not visible in FIG. 1, and cooling holes 4, which are on the external surface 5 of the component 1 as well as on the platform 3 of the component. Through the cooling holes 4 cooling air is ducted during operation of the engine to cool the external surface 5. The external surface 5 is subjected to severe attack by oxidation, corrosion and erosion due to the hot combustion gases. In many cases the article 1 consists of a nickel or cobalt base super alloy such as disclosed in the state of the art, e.g. from the document U.S. Pat. No. 5,888,451, U.S. Pat. No. 5,759,301 or from U.S. Pat. No. 4,643,782, which is known as "CMSX-4". In principle, the article 1 can be single crystal (SX) or directionally solidified (DS). While the advantages of this invention is described with reference to a turbine blade or vane as shown in FIG. 1, the invention is generally applicable to any casting component with at least one grain boundary or a casting defect comprising at least one grain boundary.

The present invention relates to a process of treatment a solid state component made from a Ni based superalloy to strengthen the grain boundaries. The present invention relates to the repair of recrystallized grains, spurious grains, slivers and freckles. in such a single crystal nickel-based superalloy after the casting while the article 1 is in the solid state and/or after a heat treatment process and before the coating with one or more protective coating layers and before the use of the article 1. With the present invention the mechanical properties of the defect area are partially restored. The presence of the grain boundary strengthening elements eliminated the detrimental effect of aforementioned casting defects.

Before applying the method according to the present invention, there may be a cleaning process to remove oxides and other undesirable contaminants in preparation for presented method. A surface diffusion process is then applied to the article 1 which enriches the grain boundaries of the defect with one or more grain boundary strengthening elements without forming brittle precipitates like borides or carbides. As grain boundary strengthening elements, boron, hafnium, zirconium or mixtures of those elements might be used. As a surface diffusion process a powder pack process, past/slurry application or any other Chemical Vapor Deposition (CVD) process known from the state of the art is suitable. This process could take place at any time in the manufacturing process such as before, during or after the solution and/or precipitation hardening heat treatments. After the surface diffusion, a post-diffusion heat treatment might be applied to intensify the diffusion of the strengthening elements along grain boundaries. Metal sheets or other devices can be used to cover defect-free surface parts for protecting them from the applied surface diffusion process.

After the surface diffusion process or after post-diffusion process, the defect surface might be re-machined if a smooth and clean surface is needed. A layer of enriched material with the strengthening elements on the surface of the article 1 is thereby removed by chemical or mechanical means.

EXAMPLE OF THE INVENTION

Figure 2:
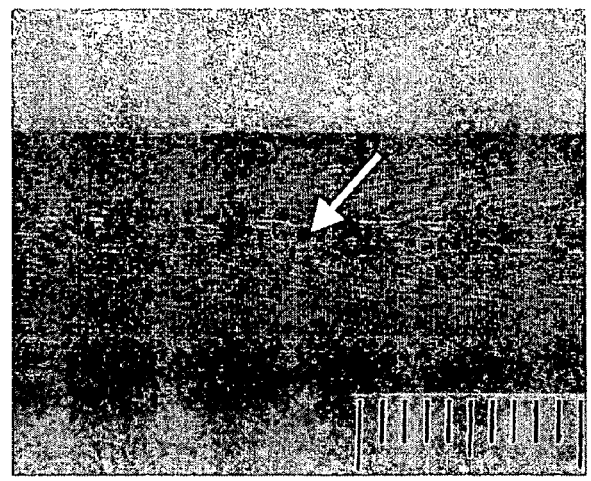
FIG. 2 shows a recrystallized area in a sample of a single crystal nickel-based superalloy CMSX-4 and FIG. 3 illustrates the results from LCF testing at 950° C. with 2 min dwell time in compression.

A sample of CMSX-4 single crystal nickel-based superalloy contained a re-crystallized area as shown in FIG. 2 (see arrow). Due to the presence of weak grain boundaries, the fatigue life of the sample is lower than that of a defect-free sample.

Figure 3:
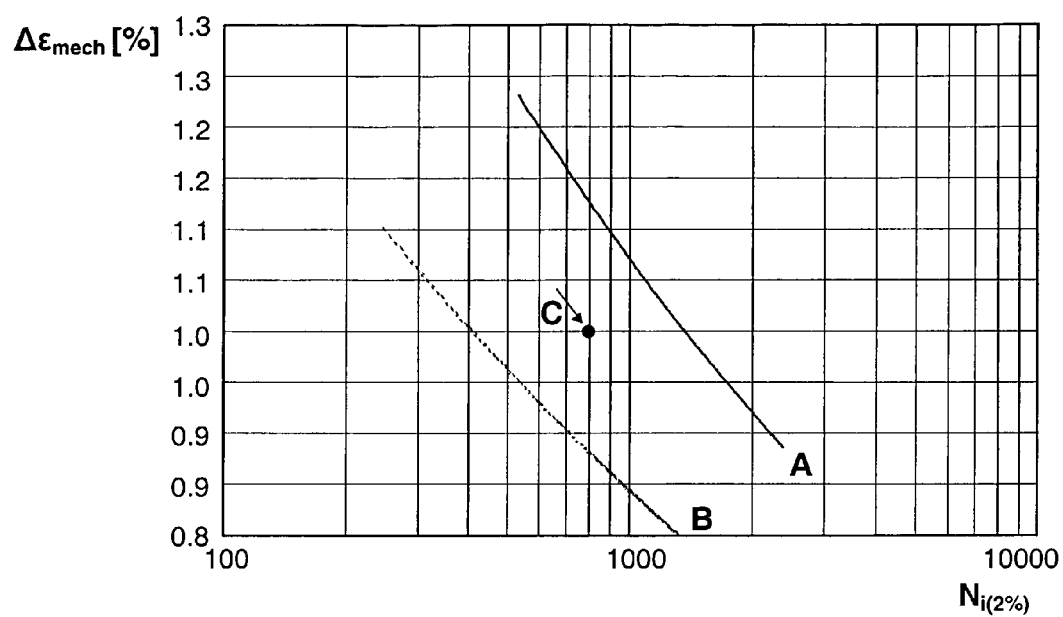

In order to improve the fatigue resistance of the defect containing sample, a surface diffusion process was applied. The sample was heat treated in a powder pack of the boron containing powder Ekabor-Ni (H. J. Hunger, HTM, 49, 215, 1994). Due to a chemical reaction, boron is set free which diffuses onto the defect surface of the article 1. It enters the metal and diffuses further along grain boundaries. Metal sheets covered the defect-free surface parts for protecting them from boronizing. The boronizing process was done at 850° C. for 3 hours. After that, the sample was removed from the powder pack and cleaned by mild sand grit blasting. For a sufficient enrichment of the grain boundaries with the strengthening element boron, a subsequent diffusion heat treatment was done. The sample was annealed in a vacuum furnace at 980° C. for 24 hours. During this time, the boron-rich surface donates boron atoms, which diffuse downward grain boundaries into the base metal. Before testing, the brittle boride surface layer, which formed during the boronizing process, was machined off by grinding. For comparing the fatigue resistance of the repaired sample with a non-repaired sample (line B) and a defect-free sample (line A), low cycle fatigue (LCF) tests were performed. Tests were done at 950° C. under strain controlled conditions in [001] direction with a 2 min dwell time in compression. A ratio between minimum and maximum strain of −1 was selected. The results (FIG. 3, repaired material is marked by arrow C) clearly show a fatigue resistance improvement by a factor of two compared to the non-repaired sample due to the aforementioned process.

REFERENCE NUMBERS

1 Article
2 Blade
3 Platform
4 Cooling holes
5 External surface of article 1
6 Layer of MCrAlY

The invention claimed is:

1. A method for strengthening grain boundaries of a single crystal or a directionally solidified article made from a Ni based superalloy while the article is in a solid state after casting and containing at least one grain boundary or a casting defect with at least one grain boundary, the method comprising the step of:

(a) applying a surface diffusion process to a surface of the article, thereby (b) diffusing grain boundary strengthening elements of one or a combination of boron, hafnium, zirconium along the at least one grain boundary of the article to enrich the at least one grain boundary with said grain boundary strengthening elements without forming precipitates.

2. The method according to claim 1, comprising the step of applying as a surface diffusion process a powder pack process, a past/slurry application or any other Chemical Vapor Deposition process known from the state of the art.

3. The method according to claim 1, comprising the step of applying a post-diffusion heat treatment after the surface diffusion process to intensify the diffusion of the strengthening elements along the at least one grain boundary.

4. The method according to claim 1, comprising the step of removing a layer of enriched material of the strengthening elements on the surface of the article chemically or mechanically after the surface diffusion process or after the post-diffusion heat treatment.

5. The method according to claim 1, comprising the step of applying the surface diffusion process to the article before, during or after the solution and/or precipitation hardening heat treatments.

6. The method according to claim 1, comprising the step of covering defect-free surface parts of the article for protecting them from the surface diffusion process.

7. The method according to claim 1, comprising the step of cleaning oxides and other contaminants from the surface of the article before the surface diffusion process.

8. The method according to claim 1, comprising the step of repairing an article with one or a combination of a precrystalized grain, a spurious grain, a sliver or a freckle as casting defect.

9. The method according to claim 1, comprising the step of applying the surface diffusion process to at least one grain boundary or a casting defect of a gas turbine component as an article.

* * * * *